United States Patent
Hofer

(10) Patent No.: US 7,492,122 B2
(45) Date of Patent: Feb. 17, 2009

(54) METHOD AND APPARATUS FOR DETECTING THE CELL COUNT IN A BATTERY PACK

(75) Inventor: Richard A. Hofer, Gardner, KS (US)

(73) Assignee: Castle Creations, Inc., Olathe, KS (US)

( * ) Notice: Subject to any disclaimer, the term of this patent is extended or adjusted under 35 U.S.C. 154(b) by 452 days.

(21) Appl. No.: 11/325,012

(22) Filed: Jan. 3, 2006

(65) Prior Publication Data

US 2007/0152635 A1    Jul. 5, 2007

(51) Int. Cl.
*H01M 10/46* (2006.01)
(52) U.S. Cl. ....................................... 320/106
(58) Field of Classification Search .............. 320/106, 320/107, 110, 116, 132, 149
See application file for complete search history.

(56) References Cited

U.S. PATENT DOCUMENTS 5,627,453 A * 5/1997 Sheehan et al. ............. 320/134
2006/0097699 A1 * 5/2006 Kamenoff ................... 320/132

* cited by examiner

*Primary Examiner*—Edward Tso
(74) *Attorney, Agent, or Firm*—Shook, Hardy & Bacon LLP

(57) ABSTRACT

A method and apparatus for detecting a number of battery cells in a battery pack is provided which includes an electronic detection circuit with a memory. The electronic detection circuit may be an electronic speed controller for a radio controlled model. The electronic speed controller measures the battery pack voltage on power up to determine the cell count and the appropriate cutoff voltage for the determined cell count. The electronic speed controller provides an indication to the operator to verify that the correct cell count was determined.

15 Claims, 1 Drawing Sheet

METHOD AND APPARATUS FOR DETECTING THE CELL COUNT IN A BATTERY PACK

FIELD OF THE INVENTION

The present invention relates to a method and apparatus for detecting a number of battery cells and, more particularly, to a method and apparatus for determining the number of battery cells in a battery pack for use with an electronic speed controller to verify the correct controller settings.

BACKGROUND OF THE INVENTION

Radio controlled models such as airplanes, helicopters, boats and cars are known in the art. Battery powered remote controlled models typically include a battery pack with one or more cells, a direct current ("DC") motor that drives the propeller or wheels, a radio receiver, and an electronic speed controller ("ESC"). Some ESCs include an automatic cutoff voltage feature which sets a cutoff voltage based on the battery pack voltage measured by the ESC. If one or more of the cells are not fully charged or if a cell is defective, the cutoff voltage may be set to a value which allows the battery pack to be discharged to a level that causes irreversible damage to the cells.

SUMMARY OF THE INVENTION

The present invention provides a method and apparatus for determining the number of cells in a battery pack and providing an indication to the operator to verify the number of cells. On power up, the ESC measures the voltage of the battery pack. The ESC determines the number of cells in the battery pack. Based on the number of cells, the ESC sets the appropriate cutoff voltage. An audio and/or visual indication is provided to the operator to verify that the number of cells has been correctly identified and that the correct cutoff voltage has been set by the ESC.

DETAILED DESCRIPTION

Figure 1:
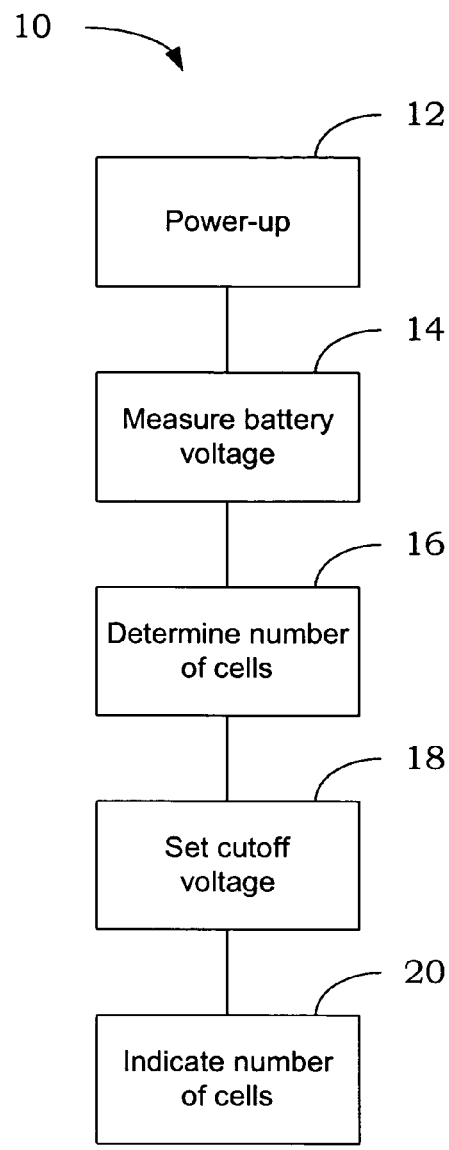
FIG. 1 is a flow chart illustrating the method of the present invention.
Figure 2:
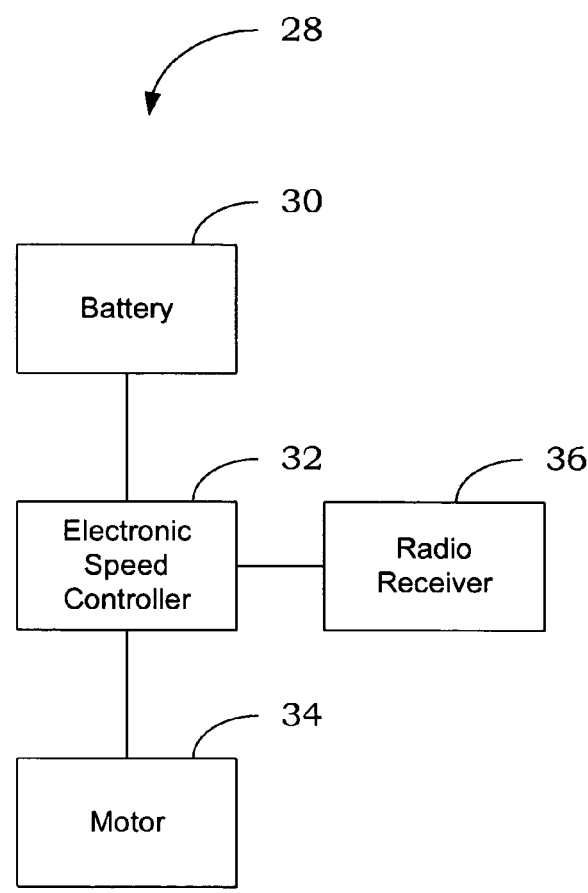
FIG. 2 is a functional block diagram of the components of a radio controlled model.

Referring to FIGS. 1 and 2, the method of the present invention is generally indicated by reference numeral 10 and a functional block diagram of the components of a battery powered radio controlled model is generally indicated by reference numeral 28. A radio controlled model typically includes a battery 30, an electronic speed controller 32, a motor 34 and a receiver 36. The ESC 32 may include a microprocessor, an input circuit, a power stage circuit, and a programmable memory, such as the Phoenix line of controllers available from Castle Creations in Wellsville, Kans, for example.

When the ESC 32 is initially powered up, block 12, the battery pack voltage is input to an analog to digital converter and read by the ESC 32, block 14. The associated number of battery cells is calculated by the ESC 32, block 16, and the appropriate cutoff voltage is set, block 18. Once the number of cells is determined, this information is presented to the operator through a series of beeps (audio) and/or flashing LEDs (visual) on the ESC 32, block 20.

A table of values is based on equations that represent the characteristics of the cells. For example, a fully charged lithium polymer cell has a voltage of approximately 4.2 volts. The nominal voltage may then be calculated as follows:

Nominal Charged Voltage=(Number of Cells)*4.2

Variations in measured cell voltages may occur due overcharging of the battery pack or errors in the analog to digital converter. These variations may be taken into account to calculate the maximum voltage by adding a constant such as 0.5 to the nominal charged voltage as follows:

Max Voltage=Nominal Charged Voltage+Constant

A minimum voltage calculation is based on the nominal charged voltage for the number of cells minus one and the constant as follows:

Min Voltage=(Number of Cells−1)*4.2 +Constant

The cutoff voltage for a lithium polymer cell may be calculated based on the "dead" cell voltage of 3 volts as follows:

Cutoff Voltage=(Number of Cells)*3

Accordingly, the following table may be calculated for any number of cells:

| Cells | Nominal Charged Voltage | Max Voltage | Min Voltage | Cutoff Voltage |
|---|---|---|---|---|
| 2 | 8.4 | 8.9 | 4.7 | 6 |
| 3 | 12.6 | 13.1 | 8.9 | 9 |
| 4 | 16.8 | 17.3 | 13.1 | 12 |
| 5 | 21 | 21.5 | 17.3 | 15 |
| 6 | 25.2 | 25.7 | 21.5 | 18 |
| 7 | 29.4 | 29.9 | 25.7 | 21 |
| 8 | 33.6 | 34.1 | 29.9 | 24 |
| 9 | 37.8 | 38.3 | 34.1 | 27 |
| 10 | 42 | 42.5 | 38.3 | 30 |
| 11 | 46.2 | 46.7 | 42.5 | 33 |
| 12 | 50.4 | 50.9 | 46.7 | 36 |
| 13 | 54.6 | 55.1 | 50.9 | 39 |

The values in this table may be stored in the programmable memory and accessible by the processor of the ESC. It should be understood by one skilled in the art that the values in the above table are dependent on the voltage of a cell. If other cells are used in a battery pack which have a voltage other than the above example, or which have different characteristics, the table may be appropriately adjusted. Additionally, the values may be dynamically calculated by the microprocessor, rather than read from a table.

By comparing the battery pack voltage with discrete values to determine the appropriate cutoff voltage, battery cells that are not fully charged or are not functioning properly may not be detected. By presenting the discrete cell count determined by the ESC to the user, the user can verify that the correct number of cells has been detected from the input voltage, and consequently, the correct cutoff voltage has been set by the ESC.

If the cell count presented to the user is not correct, the user may halt operation before damage to the battery pack occurs. The user may cycle power to the ESC to check the cell count again, or check the battery pack connection to the ESC to ensure that the battery pack was correctly connected, or the user may replace the battery pack with another one and recharge the first battery pack before using again, for example. In this way, the user may enjoy operation of his or her radio controlled model with the confidence that the ESC has correctly set the cutoff voltage so that the battery pack will not be damaged.

It should be understood that while certain forms of this invention have been illustrated and described, it is not limited thereto except insofar as such limitations are included in the following claims.

Having thus described the invention, what is claimed as new and desired to be secured by Letters Patent is as follows:

1. A method of detecting the number of cells in a battery pack inside an RC vehicle:
   a. measuring a voltage across a pair of leads of said battery pack,
   b. comparing the measured voltage to a table of values, and
   c. selecting a cell count from said table corresponding to said measured voltage.

2. The method as set forth in claim 1, further comprising indicating the number of cells corresponding to said cell count.

3. The method as set forth in claim 2, wherein said indication is a series of audio beeps.

4. The method as set forth in claim 2 wherein said indication is a series of flashes of light.

5. The method as set forth in claim 1, further comprising the step of providing an audio indication of said cell count.

6. The method as set forth in claim 1, further comprising the step of providing a visual indication of said cell count.

7. An apparatus for indicating the battery cell count of a battery pack comprising:
   an electronic detection circuit having a microprocessor and a memory,
   a battery pack having two or more cells connected to said electronic detection circuit,
   said electronic detection circuit responsive to an input voltage received from said battery pack to compare said input voltage to a predetermined table of voltage values stored in said memory, and reading a cell count corresponding to said input voltage,
   said electronic detection circuit providing an indication of said cell count read from said memory.

8. The apparatus as set forth in claim 7 further comprising an audio output generated by said electronic detection circuit indicative of said cell count.

9. The apparatus as set forth in claim 7 further comprising a visual output generated by said electronic detection circuit indicative of said cell count.

10. A method of detecting and indicating the number of cells in a battery pack:
    a. measuring a voltage across a pair of leads of said battery pack,
    b. calculating a cell count from said measured voltage, and
    c. indicating the number of cells corresponding to said cell count.

11. The method as set forth in claim 10, wherein the step of calculating a cell count from said measured voltage comprises dynamically calculating, by a microprocessor, the cell count from said measured voltage.

12. The method as set forth in claim 10, further comprising the step of providing an audio indication of said cell count.

13. The method as set forth in claim 12 wherein said audio indication is a series of beeps corresponding to the determined cell count.

14. The method as set forth in claim 10, further comprising the step of providing a visual indication of said cell count.

15. The method as set forth in claim 14 wherein said audio indication is a series of light blinks corresponding to the determined cell count.

* * * * *